(12) United States Patent
Kano (10) Patent No.: US 6,388,275 B1
(45) Date of Patent: May 14, 2002

(54) COMPOUND SEMICONDUCTOR DEVICE BASED ON GALLIUM NITRIDE

(75) Inventor: Takashi Kano, Osaka-fu (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 09/463,985

(22) PCT Filed: Aug. 12, 1998

(86) PCT No.: PCT/JP98/03611

§ 371 Date: May 2, 2000

§ 102(e) Date: May 2, 2000

(87) PCT Pub. No.: WO99/09602

PCT Pub. Date: Feb. 25, 1999

(30) Foreign Application Priority Data

Aug. 20, 1997 (JP) ............................................. 9-223322

(51) Int. Cl.⁷ ........................ H01L 33/00; H01L 27/15
(52) U.S. Cl. ........................ 257/94; 257/11; 257/12; 257/13; 257/79; 257/80; 257/81; 257/85; 438/22; 438/24; 438/46; 438/48; 372/43; 372/45
(58) Field of Search ................................ 257/79, 80, 81, 257/11, 12, 13, 94, 431, 85; 438/48, 22, 24, 46; 372/43, 45

(56) References Cited

U.S. PATENT DOCUMENTS

| | | |
|---|---|---|
| 4,137,123 A | 1/1979 | Bailey et al. |
| 4,253,882 A | 3/1981 | Dalal |
| 4,644,091 A | 2/1987 | Hayashi et al. |
| 5,449,626 A | 9/1995 | Hezel |

FOREIGN PATENT DOCUMENTS

| | | | |
|---|---|---|---|
| EP | 0477424 A1 | | 4/1992 |
| JP | 3-203388 | | 9/1991 |
| JP | 4-199752 | | 7/1992 |
| JP | 5-41560 | | 2/1993 |
| JP | 9-116234 | | 5/1997 |
| JP | 9-148678 | | 6/1997 |
| JP | 9-148678 A | * | 6/1997 |
| JP | 9-266327 | | 10/1997 |
| JP | 9-266327 A | * | 10/1997 |
| JP | 10-163571 A | * | 6/1998 |

OTHER PUBLICATIONS

Abstract of Japanese Patent Publ. No. 09148678; dated Jun. 6, 1997.
Abstract of Japanese Patent Publ. No. 08288587; dated Nov. 1, 1996.
"Optical Reflectance of Textured Silicon Surfaces Coated with an Antireflective Thin Film," Thin Solid Films, vol. 290/291, Dec. 15, 1996, pp. 23–29.

* cited by examiner

Primary Examiner—Tom Thomas
Assistant Examiner—Doughee Kangb
(74) Attorney, Agent, or Firm—Arent Fox Kintner Plotkin & Kahn, PLLC (57) ABSTRACT

A compound semiconductor device based on gallium nitride which can have a thick gallium nitride semiconductor layer serving to prevent cracks or defects attributable to a strain caused by a difference in lattice constant or coefficient of thermal expansion. Between a contact layer 4 consisting of a film of n-type GaN and a clad layer 5 consisting of a film of a n-type $Al_yGa_{1-y}N$ is interposed a crack-preventive buffer layer 5 having both of the compositions of the two films.

6 Claims, 7 Drawing Sheets

COMPOUND SEMICONDUCTOR DEVICE BASED ON GALLIUM NITRIDE

FIELD OF THE INVENTION

The present invention relates to a compound semiconductor device based on gallium nitride, which is suitable for a light emitting device such as a light emitting diode, a laser diode or the like.

BACKGROUND OF THE INVENTION

A compound semiconductor based on indium gallium nitride ($In_xGa_{1-x}N$) has been paid attention as a material that can obtain light emission having wavelength in the visible range by varying a composition (x) of indium. A ridge-shaped MQW laser diode based on InGaN using such material has been proposed (see S17 to S20 in a script for the 17th annual lecture of The Laser Society of Japan).

Figure 12:
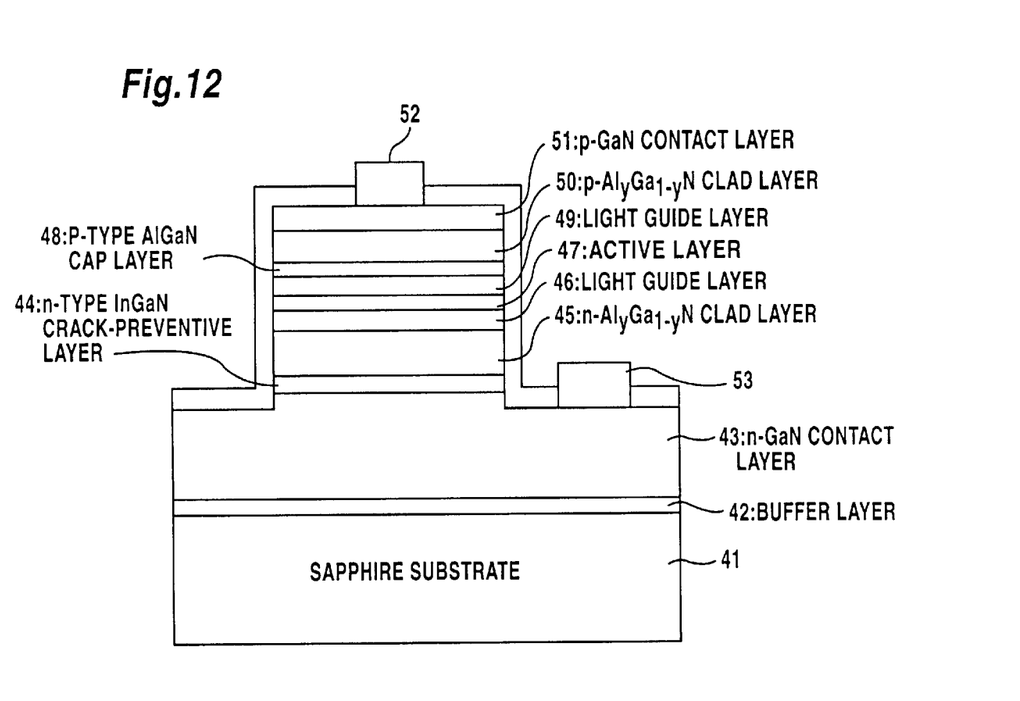
FIG. 12 is a longitudinal sectional side view illustrating a conventional MQW laser diode based on InGaN.

Above mentioned ridge-shaped MQW laser diode based on InGaN, as shown in FIG. 12, is made by forming a GaN buffer layer 42, an n-type GaN contact layer 43, an n-type InGaN crack-preventive layer 44, an n-type $Al_yGa_{1-y}N$ clad layer 45, an n-type GaN guide layer 46, an MQW active layer composed of InGaN 47, a p-type AlGaN cap layer 48, a p-type GaN guide layer 49, a p-type $Al_yGa_{1-y}N$ clad layer 50, and a p-type GaN contact layer 51 in this order on a sapphire substrate 41. A p-electrode 52 is formed on the p-type contact layer 51 and an n-electrode 53 is formed after etching to the n-type contact layer 43.

In the compound semiconductor device based on indium gallium nitride such as the ridge-shaped MQW laser diode based on InGaN, a crack is generated on a clad layer due to a difference in lattice constant or coefficient of thermal expansion when an AlGaN, as the clad layer, is formed on a contact layer by epitaxial growth. As a result, a thick AlGaN layer can not be formed. Although the n-type InGaN crack-preventive layer is interposed between the clad layer and the contact layer in the ridge-shaped MQW laser diode based on InGaN, the clad layer containing AlGaN to be formed on the n-type InGaN crack-preventive layer cannot be thick because the clad layer containing AlGaN is different from the n-type InGaN crack-preventive layer in lattice constant or coefficient of thermal expansion.

The present invention was made in consideration of the above mentioned present problems and has an objective to provide a semiconductor device capable of preventing cracks or defects attributable to a strain caused by a difference in lattice constant and coefficient of thermal expansion and forming a thick gallium nitride semiconductor layer.

DISCLOSURE OF THE INVENTION

A compound semiconductor device based on gallium nitride according to the present invention comprises a buffer layer having both compositions substantially the same as those of a first compound semiconductor layer based on gallium nitride and a second compound semiconductor layer based on gallium nitride is interposed between the first compound semiconductor layer based on gallium nitride and the second compound semiconductor layer based on gallium nitride of which a composition is different from that of the first compound semiconductor layer based on gallium nitride.

The buffer layer has a superstructure layer formed by alternately laminating a layer which has substantially the same composition as that of the first compound semiconductor layer based on gallium nitride and a layer which has substantially the same composition as that of the second compound semiconductor layer based on gallium nitride.

Furthermore, the buffer layer can be formed by varying a composition ratio from a composition ration substantially the same as that of the first compound semiconductor layer based on gallium nitride to a composition ratio substantially the same as that of the second compound semiconductor layer based on gallium nitride.

A compound semiconductor device based on gallium nitride according to the present invention comprises an one-type conductive contact layer containing a first compound semiconductor layer based on gallium nitride, an one-type conductive clad layer containing a second compound semiconductor layer based on gallium nitride having a different composition from the first compound semiconductor layer based on gallium nitride, an active layer of a single quantum well structure composed of indium gallium nitride, an other-type conductive clad layer containing a second compound semiconductor layer based on gallium nitride having a different composition from the first compound semiconductor layer based on gallium nitride, and an other-type conductive contact layer containing the first compound semiconductor layer based on gallium nitride, and a buffer layer having both compositions substantially the same as those of the first and second compound semiconductor layers based on gallium nitride are interposed at least between the one-type conductive contact layer and the other-type conductive clad layer.

The buffer layer having both compositions substantially the same as those of the first and second compound semiconductor layers based on nitride gallium is interposed above and below the clad layer.

When the buffer layer is formed between the first and second compound semiconductor layers based on gallium nitride, the buffer layer modifies a difference in lattice constant and coefficient of thermal expansion and prevents cracks and defects caused by a difference in lattice constant or coefficient of thermal. Accordingly, even when eptaxially growing a thick n-type or p-type compound semiconductor layer based on gallium nitride, a crack does not occur, thus realizing a light emitting element capable of effective carrier confinement and optical confinement in an active layer.

PREFERRED EMBODIMENTS OF THE INVENTION

Detail description is made on the present invention by referring to the attaching drawings.

Figure 1:
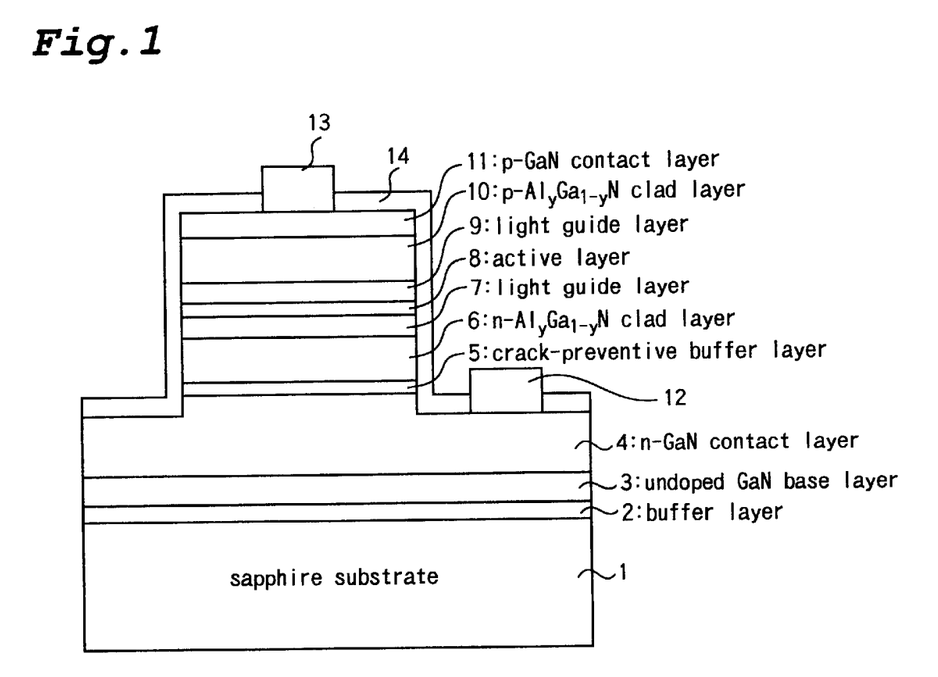
FIG. 1 is a longitudinal sectional side view illustrating a semiconductor laser diode using a single quantum well structure (SQW) or a multiple quantum well structure (MQW) containing an film of $In_yGa_{1-y}N$ compound semiconductor as an active layer, and showing a first embodiment of a compound semiconductor device based on gallium nitride according to the present invention.

FIG. 1, illustrating a first embodiment of a compound semiconductor device based on nitride gallium according to the present invention, is a longitudinal sectional side view of a semiconductor laser diode using a single quantum well structure (SQW) or a multiple quantum well structure (MQW) containing a film of $In_xGa_{1-x}N$ compound semiconductor as an active layer.

In the semiconductor laser diode, an AlGaN buffer layer 2 of 100–200 Å in thick and an undoped nitride gallium base layer 3 of 400 Å in thick, as an n-type compound semiconductor based on nitride, are formed on a sapphire substrate 1. As an n-type contact layer 4, a film of n-type GaN which is doped with silicon (Si) of approximately 30000 Å in thick is formed on the GaN base layer 3. A crack preventive layer 5 having both compositions of the contact layer 4 of the film of n-type GaN and a clad layer 6 is formed on the contact layer 4 containing the film of n-type GaN. The crack preventive buffer layer 5 will be described in detail later.

An n-type $Al_yGa_{1-y}N$ clad layer 6 of 5000 Å in thick is formed on the crack preventive buffer layer 5. A light guide layer 7 containing a film of undoped GaN or n-type GaN of approximately 300 Å is formed on the clad layer 6, and an active layer 8 of a single quantum structure (SQW) or a multiple quantum structure (MQW) composed of InGaN is formed on the light guide layer 7. A light guide layer 9 containing a film of p-type GaN of approximately 300 Å in thick and a clad layer 10 containing a film of p-type $Al_yGa_{1-y}N$ of approximately 5000 Å in thick on which Mg is doped are formed on the active layer 8. A contact layer 11 containing a film of p-type GaN of 3000 Å in thick is formed on the clad layer 10. An n-type electrode 12 and a p-type electrode 13 are provided by mesa-etching to the depth of the n-type contact layer 4 to make the n-type electrode 12 into contact, coating with an insulating layer 14 such as a film of silicon oxide ($SiO_2$), and eliminating a p-electrode and an n-electrode of the insulating layer 14.

The crack preventive buffer layer 5, having compositions of the clad layer 6 containing a film of $Al_yGa_{1-y}N$ and the contact layer 4 containing a film of n-type GaN, modifies a difference in lattice constant or coefficient of thermal expansion between the film of n-type GaN and the film of $Al_yGa_{1-y}N$.

Therefore, the buffer layer 5 has a superstructure in which a thin film of n-type GaN which has the same composition as the contact layer 4 containing a film of n-type GaN and a thin film of $Al_yGa_{1-y}N$ which has the same composition as the n-type $Al_yGa_{1-y}N$ clad layer 6. For example, when a film of n-type $Al_{0.15}Ga_{0.85}N$ is used as the clad layer 6, the crack preventive buffer layer 5 is formed by laminating a film of n-type GaN of 50 Å in thick and a film of $Al_{0.15}Ga_{0.85}N$ of 50 Å in thick alternately.

When a film of n-type $Al_{0.15}Ga_{0.85}N$ is used a the clad layer 6, the crack preventive buffer layer 5, for example, can be formed by alternately laminating a film of n-type GaN of 50 Å in thick and a film of $Al_yGa_{1-y}N$ of 50 Å in thick and rising a composition ratio of aluminum (Al) from 0 to 0.15 in sequence so as to form a grating structure.

The crack preventive layer 5 can be any layer having compositions substantially the same as those of the contact layer 4 and the clad layer 6. For example, even though the Al composition ratio in a film of $Al_yGa_{1-y}N$ is higher than that of the clad layer 6, it can be used as the crack preventive buffer layer when the characteristics of lattice constant and coefficient of thermal expansion is substantially the same. A film of GaN which is alternately laminated with a film of $Al_yGa_{1-y}N$ can be used when the film of GaN has substantially the same GaN composition. The film can be used as a crack preventive buffer layer, even if a small amount of In is contained.

When a film of n-type $Al_{0.15}Ga_{0.85}N$ is used as a clad layer 6, the crack preventive buffer layer 5 can be formed by varying the aluminum composition ratio and sloping to the layer depth direction.

Figure 2:
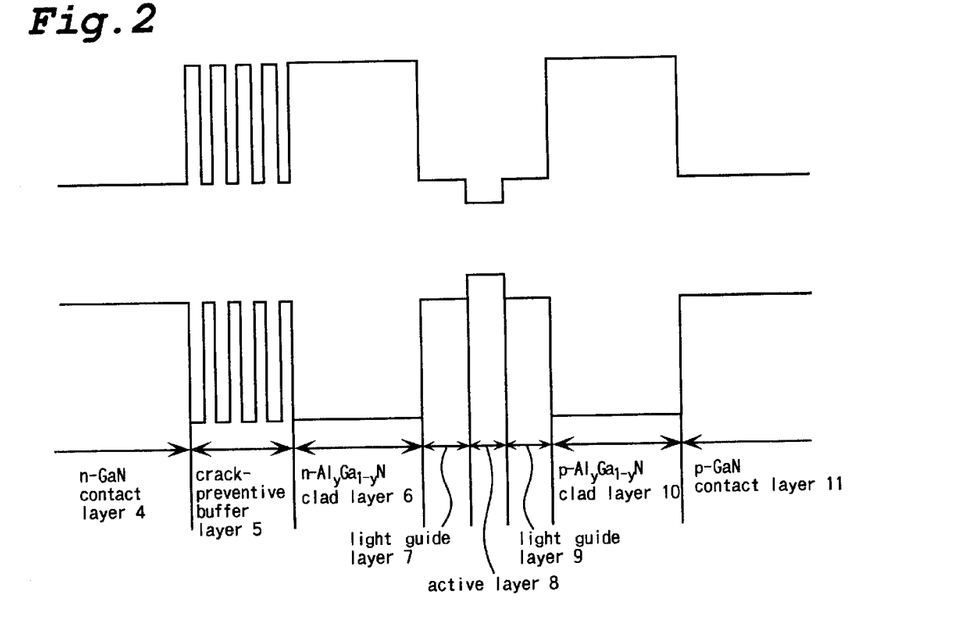
FIG. 2 is a view illustrating band energy of a semiconductor laser diode using a crack-preventive buffer layer formed by alternately laminating an n-type GaN film of 50 Å in thick and an $Al_{0.15}Ga_{0.85}N$ film of 50 Å in thick.
Figure 3:
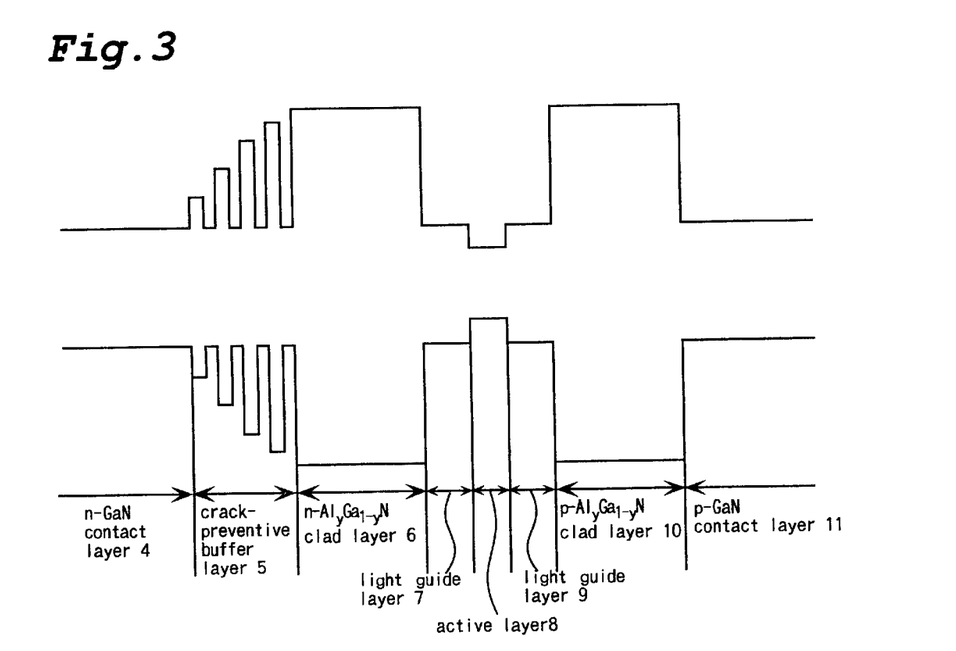
FIG. 3 is a view illustrating band energy of a semiconductor laser diode using a crack-preventive buffer layer of a grating structure where the aluminum composition ratio rises from 0 to 0.15 in sequence.
Figure 4:
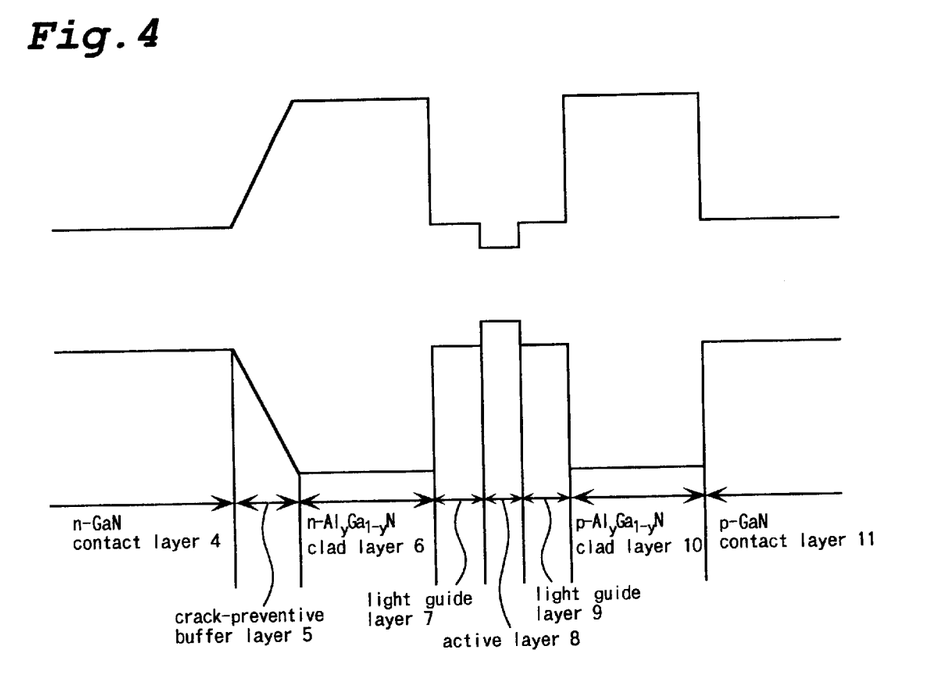
FIG. 4 is a view illustrating band energy of a semiconductor laser diode using a crack-preventive buffer layer which the aluminum composition ratio-varies by sloping to the layer depth direction.

FIGS. 2–4 illustrate energy band in which the crack preventive buffer layer 5 having the above described compositions is formed. In FIG. 2, the crack preventive buffer layer 5 in which a film of n-type GaN of 50 Å in thick and a film of $Al_{0.15}Ga_{0.85}N$ of 50 Å in thick are alternately laminated is used. In FIG. 3, the crack preventive buffer layer 5 of a grating structure where the aluminum composition ratio rises from 0 to 0.15 in sequence is used. In FIG. 4, the crack preventive buffer layer 5 which the aluminum composition ratio varies by sloping to the layer depth direction is used.

When the crack preventive buffer layer 5 is formed between the contact layer 4 and the clad layer 6, the crack preventive buffer layer 5 modifies lattice constant or coefficient of thermal expansion of both the contact layer 4 and the clad layer 6, and prevents cracks and defects caused by a difference in lattice constant or coefficient of thermal expansion. Accordingly, even when eptaxially growing thick n-type or p-type AlGaN, a crack does not occur, thus realizing a light emitting element capable of effective carrier confinement and optical confinement in an active layer.

Figure 5:
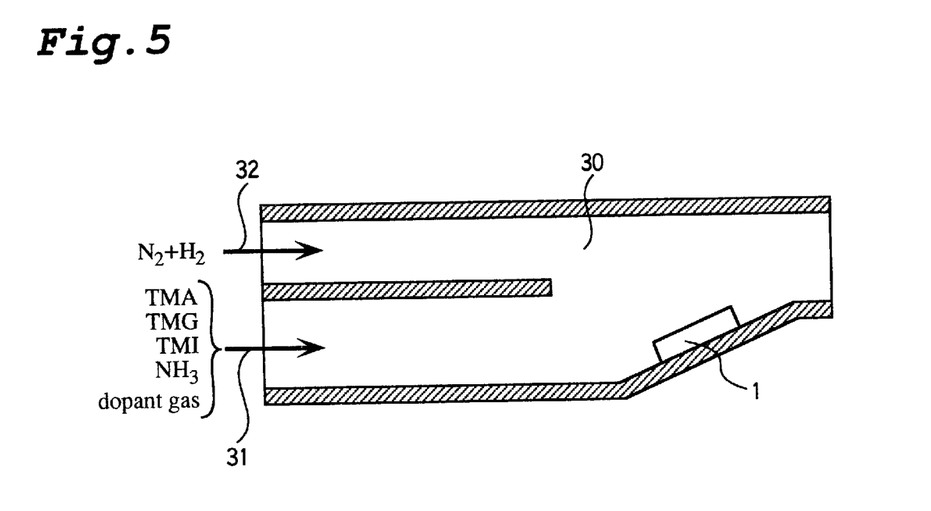
FIG. 5 is a schematic view illustrating one example of a transverse MOCVD equipment for forming the compound semiconductor layers in the present invention.

Each compound semiconductor layer of a semiconductor laser diode illustrated in FIG. 1 is formed on a sapphire substrate 1 by MOCVD method. FIG. 5 is a schematic view illustrating one example of a transverse MOCVD equipment for forming the compound semiconductor layers.

The transverse MOCVD equipment having a two laminar flow structure, supports and inclines a sapphire substrate 1 by a scepter (not shown) inside a forming chamber 30 where two laminar flow gases are mixed. The forming chamber 30 is exhausted by a vacuum pump (not shown) to a desired degree of vacuum. The scepter is heated to a desired growth temperature by a high-frequency coil etc.

In the forming chamber 30, raw material gas is supplied to a surface of the substrate 1 from a raw material gas supplying line 31, and hydrogen and/or nitride gas is supplied from an upper laminar gas line 32 located above the raw material gas supplying line 31. The upper laminar gas line 32 is connected with a hydrogen ($H_2$) gas bomb and a nitride ($N_2$) gas bomb through a valve. The raw material gas is pressured to a surface of the substrate 1 by the hydrogen ($H_2$) gas and/or nitride ($N_2$) gas supplied from the upper laminar gas line 32 so that the raw material gas can be contact with the substrate 1.

Organic metal compound source of trimethyl aluminum (TMA), trimethyl gallium (TMG), trimethyl Indium (TMI), and triethyl Gallium (TEG) as raw material gas is gasified by a small amount of bubbling gas, and is supplied to the raw material gas supplying line 31 through the valve (not shown). N-type dopant gas containing ammonia ($NH_3$) and silicon (Si) (for example, silane ($SiH_4$) ), and p-type dopant gas containing magnesium (Mg) (for example, $Cp_2Mg$) are supplied to the raw material gas supplying line 31 through the valve (not shown).

Explanation is made on manufacture of a semiconductor laser diode illustrated in FIG. 1 by using the above transverse MOCVD equipment.

An AlGaN buffer layer 2 is formed on a substrate 1. TMA, TMG, and $NH_3$ as raw material gas is supplied in a forming chamber 30, and an $Al_{0.6}Ga_{0.4}N$ buffer layer 2 of 150 Å in thick is formed on the substrate 1 while keeping the substrate temperature at 600° C.

TMG and $NH_3$ as raw material gas is supplied in the forming chamber 30, and an undoped GaN base layer 3 of 4000 Å in thick is formed on the $Al_{0.6}Ga_{0.4}N$ buffer layer 2 while keeping the substrate temperature at 1150° C.

The raw material gas is changed to TMG and $NH_3$, and the dopant gas is changed to $SiH_4$, then they are supplied to the forming chamber 30. While keeping the substrate temperature at 1150° C., a contact layer 4 containing a film of n-type GaN of 30000 Å in thick is formed on the AlGaN base layer 3.

TMG and $NH_3$ as the raw material gas and $SiH_4$ as a dopant gas are supplied to the forming chamber 30. After forming a film of n n-type GaN of 50 Å in thick is formed while keeping the substrate temperature at 1150° C., TMA is added to the raw material gas and is supplied to the forming chamber 30. Then, a film of n-type $Al_{0.15}Ga_{0.85}N$ of 50 Å in thick is formed while keeping the substrate temperature at 1150° C. Then, while controlling the TMA supply to the forming chamber 30, 10 pairs of a film of n-type GaN of 50 Å in thick and a film of n-type $Al_{0.15}Ga_{0.85}N$ of 50 Å in thick are laminated to form a crack preventive buffer layer 5 of a super structure.

TMG, TMA, and $NH_3$ as the raw material gas and $SiH_4$ as the dopant gas are supplied to the forming chamber 30. While keeping the substrate temperature at 1150° C., a clad layer 6 containing a film of n-type $Al_{0.15}Ga_{0.85}N$ layer of 3000 Å in thick is formed on the crack preventive layer 5.

The raw material gas and the dopant gas are respectively changed to TMG and $NH_3$, and $SiH_4$, and are supplied to the forming chamber 30. While keeping the substrate temperature at 1150° C., a light guide layer 7 containing a film of n-type GaN of 1000 Å in thick is formed on the clad layer 6.

The raw material gas is changed to TMI, TEG, and $NH_3$, and is supplied to the forming chamber 30. While keeping the substrate temperature at 860° C., a film of $In_{0.05}Ga_{0.95}N$ of 70 Å in thick, as a barrier layer, is formed on the light guide layer 7. Then, while keeping the substrate temperature at 800° C., a film of $In_{0.15}Ga_{0.85}N$ of 30 Å in thick, as a well layer, is formed. Twenty pairs of these two layers are laminated to form an active layer having a MQW structure and InGaN composition.

The raw material gas and the dopant gas are respectively changed to TMG and $NH_3$, and $Cp_2Mg$, and are supplied to the forming chamber 30. While keeping the substrate temperature at 1150° C., a light guide layer 9 containing a film of Mg-doped p-type GaN of 1000 Å in thick is formed.

The raw material gas and the dopant gas are respectively changed to TMA, TMG, and $NH_3$, and $Cp_2Mg$, and are supplied to the forming chamber 30. While keeping the substrate temperature at 1150° C., a clad layer 10 containing a film of Mg-doped p-type $Al_{0.15}Ga_{0.85}N$ of 3000 Å in thick is formed.

The raw material gas and the dopant gas are respectively changed to TMG and $NH_3$, and $Cp_2Mg$, and are supplied to the forming chamber 30. While keeping the substrate temperature at 1150° C., a contact layer 11 containing a film of p-type GaN of 3000 Å in thick is formed on the clad layer 10.

After exposing a surface of the n-type contact layer by mesa etching, an insulating layer 14 containing $SiO_2$ is formed. After eliminating an insulating layer of electrodes, an n-type electrode 12 and a p-type electrode 13 are formed.

The above manufacture method is about a composition where the crack preventive buffer layer 5 has a superstructure. In addition, when the crack preventive buffer layer has grating as shown in a band energy diagram in FIG. 3, the supply amount of TMA can be controlled to increase gradually. When the Al composition ratio varies and the film has a slope to the layer depth direction as shown in a band energy diagram in FIG. 4, the supply amount of TMA can increase gradually.

Figure 6:
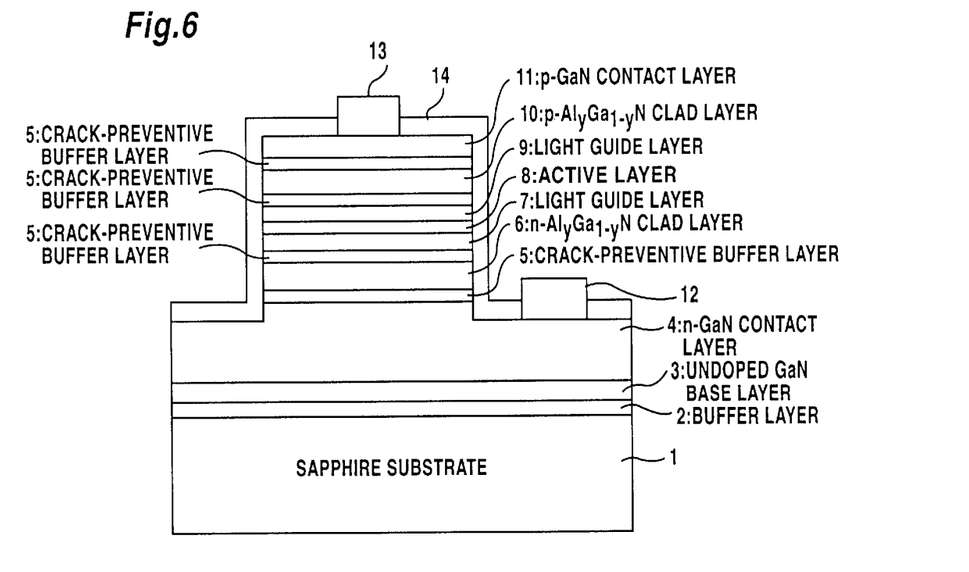
FIG. 6 is a longitudinal sectional side view illustrating a semiconductor laser diode using a single quantum well structure (SQW) or a multiple quantum well structure (MQW) containing a film of $In_yGa_{1-y}N$ compound semiconductor as an active layer and showing a second embodiment of a compound semiconductor device based on gallium nitride according to the present invention.

FIG. 6, illustrating a second embodiment of a compound semiconductor device based on nitride gallium according to the present invention, is a longitudinal sectional side view of a semiconductor laser diode using a single quantum well structure (SQW) or a multiple quantum well structure (MQW) containing a film of $In_xGa_{1-x}N$ compound semiconductor as an active layer. While the first embodiment is provided with the crack preventive buffer layers 5 between the contact layer 4 containing a film of n-type GaN and the clad layer 6 containing a film of n-type $Al_yGa_{1-y}N$, the second embodiment is provided with the crack preventive buffer layers 5 above and below an n-type and p-type clad layers. The crack preventive buffer layers 5 are provided between the n-type contact layer 4 and the n-type clad layer 6, between the n-type clad layer 6 and the light guide layer 7, between the light guide layer 9 and the p-type clad layer 10, and between the p-type clad layer 10 and the p-type contact layer 11, and thus preventing cracks and defects.

Other compositions are the same as the first embodiment. To avoid the repetitious description, the same elements as in the first embodiment have the same reference numerals and the explanation on them is omitted.

The crack preventive buffer layer 5 in this embodiment has both compositions of the clad layer 6 or the clad layer 10 and the GaN layer provided thereabove and therebelow, so as to modify a difference in lattice constant or coefficient of thermal expansion between the film of GaN and the clad layer containing $Al_yGa_{1-y}N$. To obtain this effect, the buffer layer 5 has a superstructure where a thin film of which composition is same as a film of GaN and a thin film of $Al_yGa_{1-y}N$ of which composition is same as the clad layer are alternately laminated. For example, when a film of $Al_{0.15}Ga_{0.85}N$ layer is used as the clad layers 6 and 10, the crack preventive buffer layer 5 can be formed by alternately laminating a film of GaN of 50 Å in thick and a film of $Al_{0.15}Ga_{0.85}N$ of 50 Å in thick.

When a film of $Al_{0.15}Ga_{0.85}N$ is used as the clad layer 6, the crack preventive buffer layer 5 can be formed by alternately laminating a film of GaN of 50 Å in thick and a film of $Al_yGa_{1-y}N$ of 50 Å in thick, and making a grating structure in which an Al composition ratio rises in sequence from 0 to 0.15. The Al composition ratio is controlled so as to be higher as closer to the clad layer.

When a film of $Al_{0.15}Ga_{0.85}N$ is used as the clad layers 6 and 8, the crack preventive buffer layer 5 can be formed by varying the Al composition ratio from 0 to 0.15 and sloping to the layer depth direction. The Al composition ratio is controlled so as to be higher as closer to the clad layer.

The crack preventive buffer layer 5 having a composition substantially the same as in the first embodiment can be also used in the second embodiment.

Figure 7:
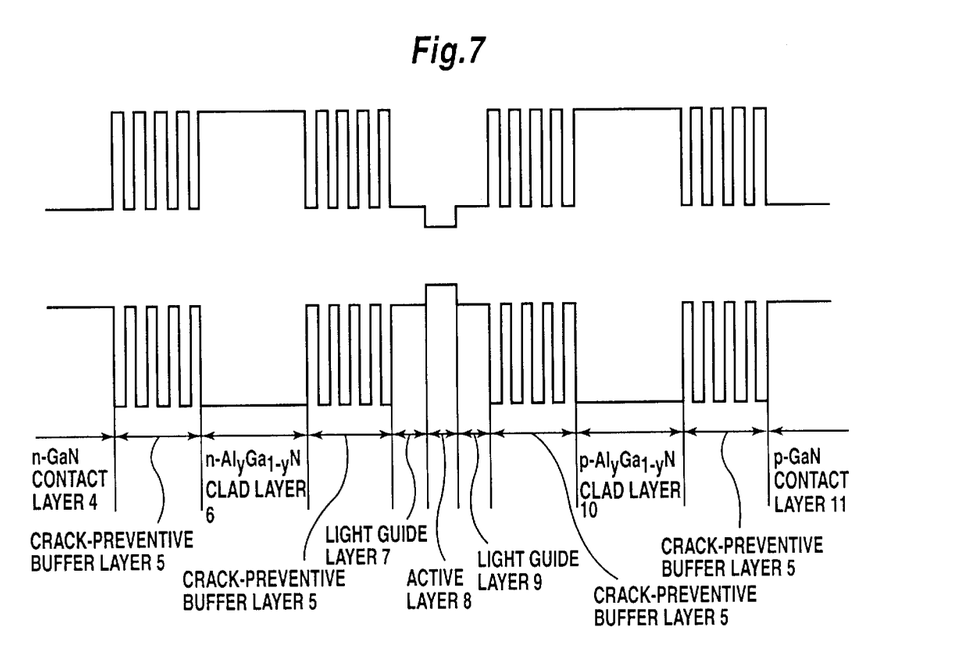
FIG. 7 is a diagram illustrating band energy of a semiconductor laser diode using a crack-preventive buffer layer formed by alternately laminating an n-type GaN film of 50 Å in thick and an $Al_{0.15}Ga_{0.85}N$ film of 50 Å in thick.
Figure 8:
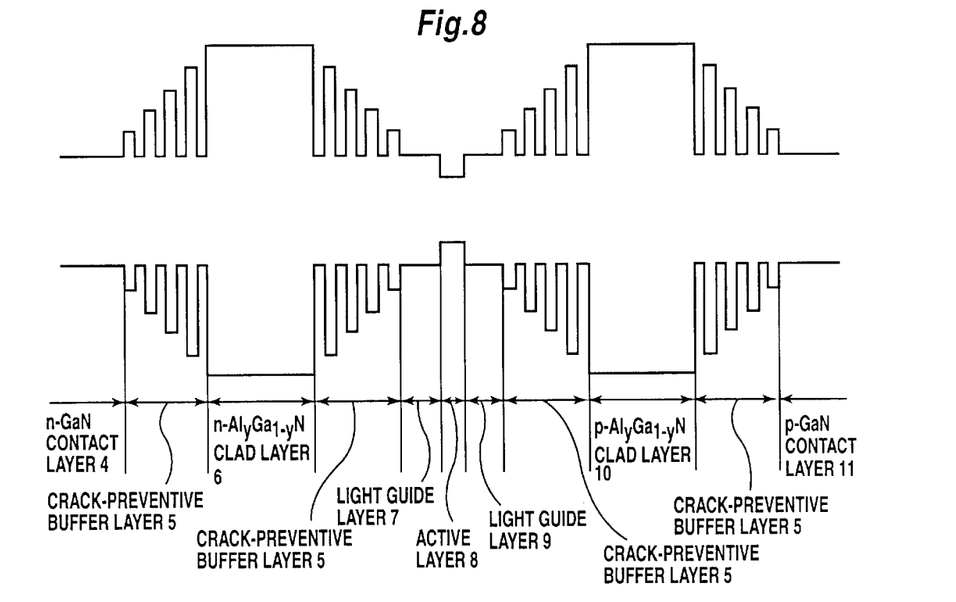
FIG. 8 is a view illustrating band energy of a semiconductor laser diode using a crack-preventive buffer layer of a grating structure where the aluminum composition ratio rises from 0 to 0.15 in sequence.
Figure 9:
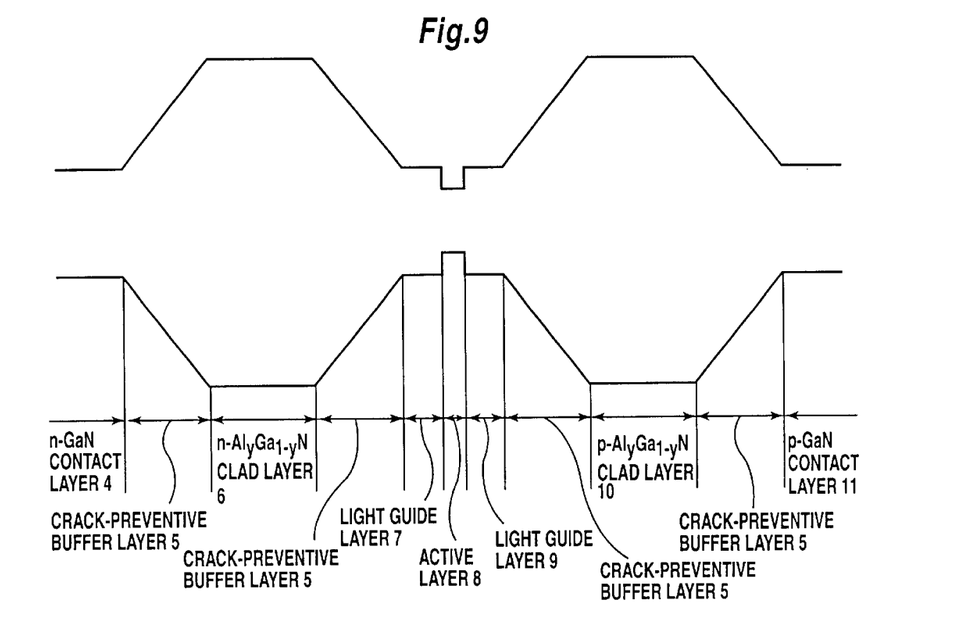
FIG. 9 is a view illustrating band energy of a semiconductor laser diode using a crack-preventive buffer layer which the aluminum composition ratio varies by sloping to the layer depth direction.

FIGS. 7–9 illustrate energy band when the crack preventive buffer layer 5 of the above composition is provided. FIG. 7 illustrates the crack preventive buffer layer 5 formed by alternately laminating a film of GaN of 50 Å in thick and a film of $Al_{0.15}Ga_{0.85}N$ of 50 Å in thick. FIG. 8 illustrates the crack preventive buffer layer 5 of a grating structure in which the Al composition ratio rises in sequence from 0 to 0.15. FIG. 9 illustrates a semiconductor laser diode using the crack preventive buffer layer 5 which the Al composition ratio varies by sloping to the layer depth direction.

When the crack preventive buffer layers 5 are formed above and below the clad layers 6 and 10, the crack preventive buffer layers 5 can modify lattice constant or coefficient of thermal expansion of both the clad layers 6 and 10 and the layers arranged on their sides, preventing cracks and defects caused by a difference in lattice constant or coefficient of thermal expansion. Consequently, when thick n- or p-type AlGaN is epitaxially grown, a crack does not occur and a light emitting element capable of effective carrier confinement and optical confinement in an active layer can be formed.

The semiconductor laser diode in FIG. 6 can be formed by the equipment in FIG. 5 as in the case of the semiconductor laser diode in FIG. 1.

Figure 10:
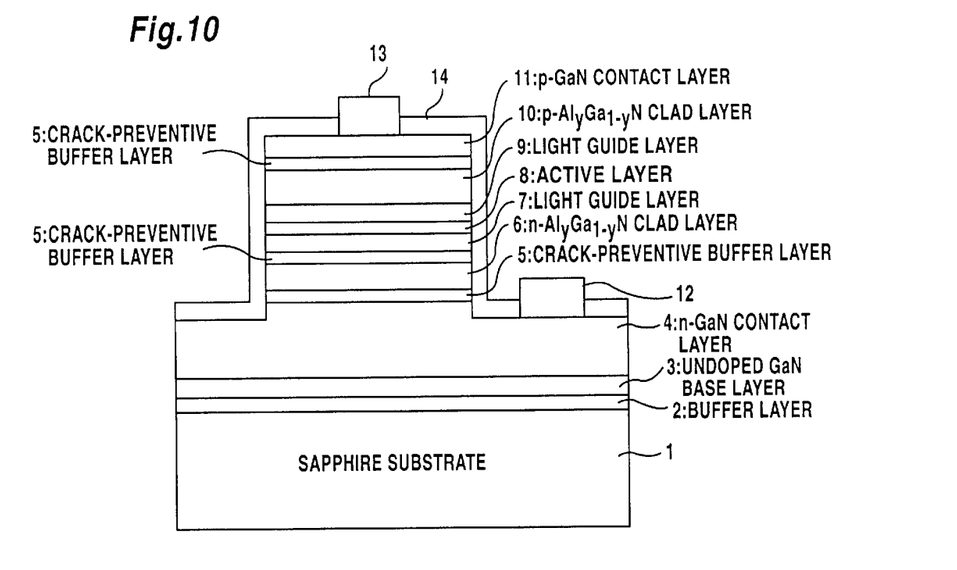
FIG. 10 is a longitudinal sectional side view illustrating a semiconductor laser diode using a single quantum well structure (SQW) or a multiple quantum well structure (MQW) containing an $In_yGa_{1-y}N$ compound semiconductor layer as an active layer and showing a third embodiment of a compound semiconductor device based on gallium nitride according to the present invention.

FIG. 10, illustrating a third embodiment of a compound semiconductor based on nitride gallium, is a longitudinal sectional side view of a semiconductor laser diode having a single quantum well structure (SQW) or a multiple quantum well structure (MQW) containing $In_xGa_{1-y}N$ compound semiconductor layer. While the first embodiment is provided with the crack preventive buffer layer 5 between the contact layer 4 containing a film of n-type GaN and the clad layer 6 containing a film of n-type $Al_yGa_{1-y}N$, the third embodiment is provided with the crack preventive buffer layer 5 above and below the n-type clad layers 6 and between the p-type clad layer 10 and the p-type contact layer 11. The crack preventive buffer layers 5 are provided between the n-type contact layer 4 and the n-type clad layer 6, between the n-type clad layer 6 and the light guide layer 7, and between the p-type clad layer 10 and the p-type contact layer 11. The n-type clad layer 6, which has the most possibility of a crack, is sandwiched between the crack preventive buffer layers 5 so as to prevent cracks and defects.

Other compositions are the same as the first embodiment. To avoid the repetitious description, the same elements as in the first embodiment have the same reference numerals and the explanation on them is omitted.

The crack preventive buffer layer 5 in this embodiment has compositions of the clad layer 6 or 10 and the film of GaN thereabove and threrbelow, so as to modify a difference in lattice constant or coefficient of thermal expansion between the film of GaN and the clad layer. To obtain this effect, the buffer layer 5 has a superstructure where a thin film of which composition is same as the film of GaN and a thin film of $Al_yGa_{1-y}N$ of which composition is same as the clad layer are alternately laminated. For example, when a film of $Al_{0.15}Ga_{0.85}N$ is used as the clad layers 6 and 10, the crack preventive buffer layer 5 can be formed by alternately laminating a film of GaN of 50 Å in thick and a film of $Al_{0.15}Ga_{0.85}N$ of 50 Å in thick.

When a film of $Al_{0.15}Ga_{0.85}N$ is used as the clad layer 6, the crack preventive buffer layer 5 can be formed by alternately laminating a film of GaN of 50 Å in thick and a film of $Al_yGa_{1-y}N$ of 50 Å in thick, and making a grating structure in which an Al composition ratio rises in sequence from 0 to 0.15. The Al composition ratio is controlled so as to be higher as closer to the clad layer.

When a film of n-type $Al_{0.15}Ga_{0.85}N$ is used as the clad layers 6 and 10, the crack preventive buffer layer 5 can be formed by varying the Al composition ratio from 0 to 0.15 and sloping to the layer depth direction. The Al composition ratio is controlled so as to be higher as closer to the clad layer.

A crack preventive buffer layer 5 having substantially the same composition as in the first embodiment can be also used in the third embodiment.

A semiconductor laser diode in FIG. 10 can be formed by the equipment in FIG. 5 as in the case of the semiconductor laser diode in FIG. 1.

Figure 11:
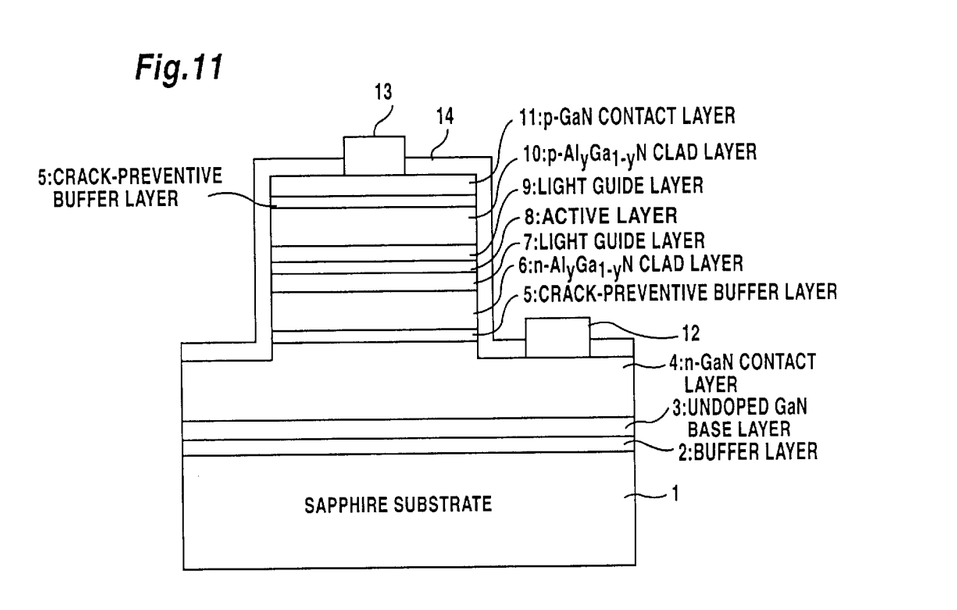
FIG. 11 is a longitudinal sectional side view illustrating a semiconductor laser diode using a single quantum well structure (SQW) or a multiple quantum well structure (MQW) containing a film of $In_yGa_{1-y}N$ compound semiconductor as an active layer, and showing a fourth embodiment of a compound semiconductor device based on gallium nitride according to the present invention.

FIG. 11, illustrating a fourth embodiment of a compound semiconductor device based on nitride gallium, is a longitudinal sectional side view of a semiconductor laser diode using a single quantum well structure (SQW) or a multiple quantum well structure (MQW) containing $In_xGa_{1-x}N$ compound semiconductor layer as an active layer. While the first embodiment is provided with the crack preventive buffer layer 5 between the contact layer 4 containing a film of n-type GaN and the clad layer 6 containing a film of n-type $Al_yGa_{1-y}N$, the fourth embodiment is further provided with the crack preventive buffer layer 5 between the p-type clad layer 10 and the p-type contact layer 11. The crack preventive buffer layers 5 are provided between the n-type contact layer 4 and the n-type clad layer 6, and between the p-type clad layer 10 and the p-type contact layer 11.

Other compositions are the same as the first embodiment. To avoid the repetitious description, the same elements as in the first embodiment have the same reference numerals and the explanation on them is omitted.

The crack preventive buffer layer 5 in this embodiment has a composition of the clad layer 6 or 10 and the film of GaN thereabove and therebelow, so as to modify a difference in lattice constant or coefficient of thermal expansion between the film of GaN and the clad layer. To obtain this effect, the buffer layer 5 has a superstructure where a thin film of which composition is same as the film of GaN and a thin film of n-type $Al_yGa_{1-y}N$ of which composition is same as the clad layer are alternately laminated. For example, when a film of $Al_{0.15}Ga_{0.85}N$ is used as the clad layers 6 and 10, a crack preventive buffer layer 5 can be formed by alternately laminating a film of GaN of 50 Å in thick and a film of $Al_{0.15}Ga_{0.85}N$ of 50 Å in thick.

When a film of $Al_{0.15}Ga_{0.85}N$ is used as the clad layers 6 and 10, the crack preventive buffer layer 5 can be formed by alternately laminating a film of GaN of 50 Å in thick and a film of $Al_yGa_{1-y}N$ of 50 Å in thick, and making a grating structure in which an Al composition ratio rises in sequence from 0 to 0.15. The Al composition ratio is controlled so as to be higher in a portion closer to the clad layer.

When a film of n-type $Al_{0.15}Ga_{0.85}N$ is used as the clad layers 6 and 10, the crack preventive buffer layer 5 can be formed by varying the Al composition ratio from 0 to 0.15 and sloping to the layer depth direction. The Al composition ratio is controlled so as to be higher as closer to the clad layer.

A semiconductor laser diode in FIG. 11 can be formed by the equipment in FIG. 5 as in the case of the semiconductor laser diode in FIG. 1.

The above embodiments are applications of the present invention to a semiconductor laser diode. When a crack occurs in other compound semiconductor device based on nitride gallium such as a light emitting diode array where a first compound semiconductor layer based on nitride gallium and a second compound semiconductor layer based on nitride gallium of which composition is different from the first compound semiconductor based on nitride gallium are grown, the above mentioned effect can be obtained by interposing a buffer layer having both compositions of the first and second compound semiconductor layers based on nitride gallium.

According to the present invention, when a first compound semiconductor layer based on nitride gallium and a second compound semiconductor layer based on nitride gallium of which composition is different from the first compound semiconductor layer based on nitride gallium are grown, a crack and a defect caused by a difference in lattice constant or coefficient of thermal expansion can be prevented by interposing a buffer layer having both compositions of the first and second compound semiconductor layers based on nitride gallium. When it is used for a semiconductor laser, carrier confinement and optical confinement in an active layer is realized.

What is claimed is:

1. A compound semiconductor device based on gallium nitride comprising
   a buffer layer having both compositions substantially the same as those of a first compound semiconductor layer comprising of gallium nitride and a second compound semiconductor layer comprising of aluminum gallium nitride, wherein said buffer layer is interposed between the first compound semiconductor layer and the second compound semiconductor layer.

2. The compound semiconductor device based on gallium nitride according to claim 1, wherein
   said buffer layer has a superstructure layer formed by alternately laminating a layer which has substantially the same composition as that of the first compound semiconductor layer and a layer which has substantially the same composition as that of the second compound semiconductor layer.

3. The compound semiconductor device based on gallium nitride according to claim 1, wherein
   said buffer layer is formed by varying a composition ratio from a composition ratio substantially the same as that of the first compound semiconductor layer to a composition ratio substantially the same as that of the second compound semiconductor layer.

4. A compound semiconductor device based on gallium nitride comprising;
   an one-type conductive contact layer containing a first compound semiconductor layer comprising of gallium nitride,
   an one-type conductive clad layer containing a second compound semiconductor layer comprising of aluminum gallium nitride,
   an active layer of a single quantum well structure composed of indium gallium nitride,
   an other-type conductive clad layer containing a second compound semiconductor layer comprising of aluminum gallium nitride,
   an other-type conductive contact layer containing the first compound semiconductor layer comprising of gallium nitride, and
   a buffer layer having both compositions substantially the same as those of said first and second compound semiconductor layers, wherein said buffer layer is interposed at least between said one-type conductive contact layer and said other-type conductive clad layer.

5. The compound semiconductor device based on gallium nitride according to claim 4, wherein
   a buffer layer having both compositions substantially the same as those of said first and second compound semiconductor layers is interposed above and below said clad layer.

6. A compound semiconductor device based on gallium nitride comprising
   a first compound semiconductor layer comprising of gallium nitride and a second compound semiconductor layer comprising of aluminum gallium nitride, and
   a buffer layer having both compositions substantially the same as those of the first and second compound semiconductor layers, wherein said buffer layer is interposed between the first compound semiconductor layer and the second compound semiconductor layer.

* * * * *